(12) United States Patent
Kanatzidis et al.

(10) Patent No.: US 8,481,843 B2
(45) Date of Patent: Jul. 9, 2013

(54) SILVER-CONTAINING P-TYPE SEMICONDUCTOR

(75) Inventors: Mercouri G. Kanatzidis, Okemos, MI (US); Kuei-Fang Hsu, Yuanlin Township, Changhua County (TW)

(73) Assignee: Board of Trustees Operating Michigan State University, East Lansing, MI (US)

( * ) Notice: Subject to any disclaimer, the term of this patent is extended or adjusted under 35 U.S.C. 154(b) by 2081 days.

(21) Appl. No.: 10/931,295

(22) Filed: Aug. 31, 2004

(65) Prior Publication Data

US 2005/0076944 A1    Apr. 14, 2005

Related U.S. Application Data

(60) Provisional application No. 60/502,819, filed on Sep. 12, 2003.

(51) Int. Cl.
*H01L 37/00* (2006.01)
*H01L 35/30* (2006.01)

(52) U.S. Cl.
USPC ........... 136/241; 136/240; 136/239; 136/238; 136/236.1; 136/205; 136/201; 252/62.3 T; 62/3.3; 62/3.2

(58) Field of Classification Search
USPC .............. 136/239, 241, 240, 238, 236.1, 205, 136/201; 252/62.3 T; 62/3.3, 3.2
See application file for complete search history.

(56) References Cited

U.S. PATENT DOCUMENTS

| | | |
|---|---|---|
| 2,602,095 A | 7/1952 | Faus |
| 2,728,637 A | 12/1955 | Alderson et al. |
| 2,770,528 A | 11/1956 | Maynard |
| 2,882,467 A | 4/1959 | Wernick |
| 2,882,468 A | 4/1959 | Wernick |
| 3,008,797 A | 4/1961 | Bither |
| 2,995,613 A | 8/1961 | Wernick |
| 3,211,655 A | 10/1965 | Fleischmann |
| 3,211,656 A | 10/1965 | Rupprecht |
| 3,238,134 A | 3/1966 | Fleischmann |
| 3,318,669 A | 5/1967 | Folberth |
| 3,945,855 A | 3/1976 | Skrabek et al. |

(Continued)

FOREIGN PATENT DOCUMENTS

| | | | |
|---|---|---|---|
| WO | WO 00/24040 | 4/2000 | ........................ 60/103 |
| WO | WO 2005/036660 | 4/2005 | ........................ 60/130 |

OTHER PUBLICATIONS

Hsu et al., "Cubic AgPbmSbTe2+m Bulk Thermoelectric Materials with High Figure of Merit", Science, vol. 303, No. 5689, Feb. 6, 2004, pp. 818-821.

(Continued)

*Primary Examiner* — Golam Mowla
(74) *Attorney, Agent, or Firm* — Harness, Dickey & Pierce, P.L.C.

(57) ABSTRACT

A thermoelectric composition comprises a material represented by the general formula $$(Ag_aX_{1-a})_{1\pm x}(Sn_bPb_{1-b})_mM'_{1-y}Q_{2+m}$$

wherein
X is Na, K, or a combination of Na and K in any proportion;
M' is a trivalent element selected from the group consisting of Sb, Bi, lanthanide elements, and combinations thereof;
Q is a chalcogenide element selected from the group consisting of S, Te, Se, and combinations thereof;
a and b are independently >0 and $\leq 1$;
x and y are independently >0 and <1; and
$2 \leq m \leq 30$.
The compositions exhibit a figure of merit ZT of up to about 1.4 or higher, and are useful as p-type semiconductors in thermoelectric devices.

55 Claims, 3 Drawing Sheets

U.S. PATENT DOCUMENTS

| | | | | |
|---|---|---|---|---|
| 4,929,282 A | * | 5/1990 | Brun et al. | 136/239 |
| 5,187,052 A | | 2/1993 | Maeda et al. | |
| 5,368,701 A | | 11/1994 | Warren et al. | |
| 5,448,109 A | | 9/1995 | Cauchy | |
| 5,606,213 A | * | 2/1997 | Kherani et al. | 310/303 |
| 5,610,366 A | | 3/1997 | Fleurial et al. | |
| 5,708,233 A | | 1/1998 | Ochi et al. | |
| 5,719,390 A | | 2/1998 | Tateishi et al. | |
| 5,726,381 A | | 3/1998 | Horio et al. | |
| 5,773,829 A | | 6/1998 | Iwanczyk et al. | |
| 5,936,193 A | | 8/1999 | Parise | |
| 6,034,318 A | | 3/2000 | Lycke et al. | |
| 6,103,967 A | | 8/2000 | Cauchy et al. | |
| 6,129,673 A | | 10/2000 | Fraden | |
| 6,225,550 B1 | * | 5/2001 | Hornbostel et al. | 136/236.1 |
| 6,312,617 B1 | | 11/2001 | Kanatzidis et al. | |
| 6,313,393 B1 | | 11/2001 | Drost | |
| 6,342,668 B1 | | 1/2002 | Fleurial et al. | |
| 6,444,894 B1 | | 9/2002 | Sterzel | |
| 2003/0056819 A1 | * | 3/2003 | Imai et al. | 136/239 |

OTHER PUBLICATIONS

Hsu et al., "Thermoelectric Properties of the cubic AgPb10SbTe12", Mat. Res. Soc. Symp. Proc. vol. 793, 2004 Materials Research Society, pp. S6.3.1-S6.3.6.

English Excerpt Translation of "Heat Conductivity, Thermopower and Electric Conductivity of Semiconductive Mixed Crystals of the $(A_{x/2}^I B_{1-x}^{IV} C_{x/2}^V)$ $D^{IV}$ Form" and German Document by Fleischmann, Zeitschrift fur Naturforschung, pp. 765-780, Jun. 1961.

"Metallurgy of Some Ternary Semiconductors and Constitution of the $AgSbSe_2$-$AgSbTe_2$-$AgBiSe$-$PbSe$-$PbTe$ System", J. H. Wernick, Bell Telephone Laboratories, Inc., Murray Hill, New Jersey, pp. 69-88, Date Unknown.

"Note on Schirmerite", L. H. Brixner, Pigments Department, Experimental Station, E. I. du Pont de Nemours & Co., Inc., Mineralogical Notes, The American Mineralogist, vol. 50, pp. 259-261, Jan.-Feb. 1965.

Article: "Thermoelectric properties of materials based on PbTe and GeTe", Chapter 15, L. Borissova et al., pp. 171-177, Date Unknown.

English Abstract: "Electron-microscope investigation of some new poly morphic thermoelectric compounds", Plust et al., Schweiz. Arch. Angew. Wiss. Techn., pp. 458-60, Nov. 1961 and German article.

English Abstract of Journal only: "Equilibrium state of a gas behind a shock wave in oxygen, nitrogen, and their mixtures with xenon", S. A. Losev, Vestnik Moskov. Univ. Fiz., Astron., No. 5, 1960.

English Abstract of German Journal: "Minerals as prototypes for new semiconductor compounds", includes document for Bush et al., Bldg. Tech. Hochschule, Zurich, Switzerland, Helv. Phys. Acta., 33, pp. 657-666, 1960 and German article.

English Abstract of Russian Journal: "Possibility of formation of solid solutions in some quaternary systems", Goryunova, et al., Vestnik Leningrad. Univ., pp. 156-158, 1961 and Russian article.

English Abstract of Journal only: "Preparation and properties of HgTe and mixed crystals of HgTe-CdTe", Lawson et al., Phys. and Chem Solids, 9, pp. 325-329, 1959.

EP 99 96 8846, European Search Report, Jan. 19, 2004, 3 pgs.

\* cited by examiner

SILVER-CONTAINING P-TYPE SEMICONDUCTOR

CROSS-REFERENCE TO RELATED APPLICATIONS

This application claims the benefit of U.S. Provisional Application No. 60/502,819, filed on Sep. 12, 2003. The disclosure of the above application is incorporated herein by reference.

SPONSORSHIP

Work on this invention was sponsored in part by the Office of Naval Research, Grant N00014-03-1-0789. The Government may have certain rights to the invention.

BACKGROUND

The present invention relates generally to thermoelectric materials. In particular, the invention relates to silver-containing semiconductor materials useful in a variety of thermoelectric devices.

A variety of thermoelectric devices are known in the art, using thermoelectric materials for the production of electricity or for cooling and heating applications. Thermoelectric devices can have distinct advantages in many applications. For example, an electric power generator based on thermoelectric materials does not use moving parts like conventional power generators. This feature significantly enhances the reliability of the thermoelectric devices by avoiding mechanical wear of the moving parts and corresponding failure. This further reduces the cost of maintenance. Thermoelectric devices also allow operation in hostile environments such as in high temperature conditions (e.g., 400-900° C.) without human attendance. The unique properties of thermoelectric materials also make the thermoelectric devices environmentally friendly, i.e., industrial heat waste or natural heat sources can be used to generate electric power.

Thermoelectric materials are metals, semi-metals, or semiconducting materials that can convert thermal energy into electrical energy, and vice versa. The basic thermoelectric effects underlying this energy conversion are the Seebeck and Peltier effects. The Seebeck effect is the phenomenon underlying the conversion of heat energy into electrical power and is used in thermoelectric power generation. When a thermoelectric material is subjected to a temperature differential, the Seebeck effect produces an open voltage across the material, which can be used to drive an external load. The complementary effect, the Peltier effect, is the phenomenon used in thermoelectric refrigeration and is related to heat absorption accompanying the passage of current through the junction of two dissimilar materials. When supplied with a voltage, thermoelectric semiconductors respond by virtue of the Peltier effect to produce a temperature differential that can heat or cool an external load.

Although the Seebeck and Peltier effects can be seen with a wide variety of materials, the magnitude of the effect (the Seebeck coefficient, S=dV/dT) is so low with most materials as to have no practical application. Only certain materials have been found to produce significant thermoelectric effects. For example, thermoelectric materials such as alloys of PbTe, and $Bi_2Te_3$, BiSb, and others of the formula $Bi_{2-x}Sb_xTe_{3-y}Se_y$, are well known in the art. However, the efficiency of thermoelectric devices made using these materials is relatively low, at approximately five to eight percent energy conversion efficiency. For the temperature range of −100° C. to 1000° C., the maximum ZT of some such thermoelectric materials is limited to values of about 1.2.

Semiconducting materials conduct electricity by using two types of carriers: electrons and "holes." When electrons predominate as the carriers, the semiconductor is said to be "n-type". When holes predominate as the carriers, the semiconductor is said to be "p-type".

Recently, thermoelectric devices using n-type semiconductor thermoelectric material have been reported in U.S. Ser. No. 60/502,819 filed Sep. 12, 2003, the disclosure of which is incorporated herein by reference in its entirety. The n-type semiconductors are based on substoichiometric silver compounds with high thermopowers and figures of merit.

Thermoelectric devices include a number of alternate n-type and p-type semiconductor elements, which are connected electrically in series by metal interconnects, and sandwiched thermally in parallel between two electrically insulating but thermally conducting ceramic plates, to form a module. If a temperature gradient is maintained across the module, electrical power will be delivered to an external load and the device will operate as a generator. Conversely, when an electric current is passed through the module, heat is absorbed at one face of the module and rejected at the other face, and the device operates as a heat pump.

An object of recent research has been to find new materials with enhanced thermoelectric properties. Several classes of materials have been investigated, including complex ternary and quaternary chalcogenides, ternary skutterudites, half-Heusler alloys, ternary metal oxides, intermetallic clathrates, and pentatellurides. Such materials have been described in the following references: Kanatzidis, Semicond Semimet, 69, 51-100, (2000); Sales et al., Science 272 (5266): 1325-1328, (1996); Poon, Semicond Semimet 70, 37-75, (2001); Terasaki et al., Jpn J Appl Phys 2 40 (IAB): L65-L67, (2001); Sales et al., J Solid State Chem 146, 528-532 (1999); Nolas et al., Semicond Semimet 69, 255-300, (2001); Latturner et al., Solid State Chem 151, 61-64 (2000); and Tritt et al., Semicond Semimet 70, 179-206, (2001). In another approach, artificial superlattice thin film structures grown from chemical vapor deposition of $Bi_2Te_3/Sb_2Te_3$, and molecular beam epitaxy (MBE) of $PbS_{0.98}Te_{0.02}$/PbTe have been described with significantly enhanced ZTs compared to their bulk counterparts. Such materials are described in the following references: Venkatasubramanian et al., J. Cryst Growth 170, 817-821, (1997); Harman et al., J Electron Mater 25, 1121-1127 (1996); Beyer et al., Appl Phys Lett 80, 1216-1218 (2002); Venkatasubramanian et al., Nature 413, 597-602, (2001); and Harman et al., J Electron Mater 29 (1): L1-L4 (2000). Nevertheless, an even more desirable breakthrough in this area would be the discovery of bulk compositions that would generate similar ZT values. This is because the vast majority of applications require materials in bulk quantities.

Accordingly there remains a need for thermoelectric materials and in particular p-type semiconductor materials, that have a high thermoelectric figure of merit. Use of such materials would produce thermoelectric devices with high efficiencies.

SUMMARY

In one embodiment, the invention provides a thermoelectric composition represented by general formula $$(Ag_aX_{1-a})_{1\pm x}(Sn_bPb_{1-b})_mM'_{1-y}Q_{2+m}$$

wherein
X is Na, K or a combination of Na and K in any proportion;

M' is a trivalent element selected from the group consisting of Sb, Bi, lanthanide elements, and combinations thereof;

Q is a chalcogenide element selected from the group consisting of S, Te, Se, and combinations thereof;

a and b are independently greater than 0 and less than or equal to 1, x and y are independently greater than 0 and less than 1; and $2 \leq m \leq 30$.

The compositions have a slight excess or deficit of +1 cations, indicated by the positive value of x, and a slight deficit of trivalent element indicated by the positive non-zero value of y. Advantageously, the compositions are found to exhibit p-type semiconductor behavior. In various embodiments, thermoelectric materials made from the semiconductor materials exhibit a figure of merit of 1.0 or greater and preferably 1.4 or greater.

In another embodiment, the invention provides thermoelectric modules comprising the p-type semiconductor materials described above and an n-type semiconductor. The thermoelectric modules may be used to produce a variety of thermoelectric devices that operate according the Peltier or Seebeck effects. In a preferred embodiment, the modules are used for power generation. The invention also includes methods for using the thermoelectric devices.

In a preferred embodiment, n-type semiconductors are of general formula $Ag_{1-z}M_nM''Q'_{2+n}$; wherein M is selected from the group consisting of Pb, Ca, Sr, Ba, divalent transition metals, and combinations thereof; M'' is selected from the group consisting of Bi, Sb, and combinations thereof; Q' is selected from the group consisting of Se, Te, S, and combinations thereof; $8 \leq n \leq 24$; and $0.01 \leq Z \leq 0.7$. In one embodiment, the materials exhibit n-type semiconductor properties. In a preferred embodiment, z is from about 0.1 to about 0.3, and n is from about 10 to about 18.

It has been found that the materials, devices, and methods of the present invention afford advantages over thermoelectric materials known in the art. Such advantages include increased efficiency, higher thermoelectric figure of merit, greater flexibility for use in a variety of devices, lower cost, stability, and ease of manufacturing. Further areas of applicability and advantages will become apparent from the detailed description provided hereinafter. It should be understood that the detailed description and specific examples, while exemplifying embodiments of the invention, are intended for purposes of illustration only and are not intended to limit the scope of the invention.

It should be noted that these Figures are intended to show the general characteristics of devices among those of this invention, for the purpose of the description of such embodiments herein. These schematics may not precisely reflect the characteristics of any given embodiment, and are not necessarily intended to define or limit specific embodiments within the scope of this invention.

DETAILED DESCRIPTION

The headings (such as "Introduction" and "Summary,") used herein are intended only for general organization of topics within the disclosure of the invention, and are not intended to limit the disclosure of the invention or any aspect thereof. In particular, subject matter disclosed in the "Introduction" may include aspects of technology within the scope of the invention, and may not constitute a recitation of prior art. Subject matter disclosed in the "Summary" is not an exhaustive or complete disclosure of the entire scope of the invention or any embodiments thereof.

The description and specific examples, while indicating embodiments of the invention, are intended for purposes of illustration only and are not intended to limit the scope of the invention. Moreover, recitation of multiple embodiments having stated features is not intended to exclude other embodiments having additional features, or other embodiments incorporating different combinations of the stated features. Specific Examples are provided for illustrative purposes of how to make, use and practice the compositions and methods of this invention and, unless explicitly stated otherwise, are not intended to be a representation that given embodiments of this invention have, or have not, been made or tested.

As used herein, the words "preferred" and "preferably" refer to embodiments of the invention that afford certain benefits, under certain circumstances. However, other embodiments may also be preferred, under the same or other circumstances. Furthermore, the recitation of one or more preferred embodiments does not imply that other embodiments are not useful, and is not intended to exclude other embodiments from the scope of the invention.

As used herein, the word "include," and its variants, is intended to be non-limiting, such that recitation of items in a list is not to the exclusion of other like items that may also be useful in the materials, compositions, devices, and methods of this invention.

In one embodiment, the invention provides a thermoelectric composition comprising a material represented by the general formula $$(Ag_aX_{1-a})_{1 \pm x}(Sn_bPb_{1-b})_mM'_{1-y}Q_{2+m}$$

wherein

X is Na, K, or a combination of Na and K in any proportion;

M' is a trivalent element selected from the group consisting of Sb, Bi, lanthanide elements, and combinations thereof;

Q is a chalcogenide element selected from the group consisting of S, Te, Se, and combinations thereof;

a and b are independently >0 and $\leq 1$;

x and y are independently >0 and <1; and $2 \leq m \leq 30$.

In preferred embodiments, x and y are independently >0.01 and <0.6; preferably $\geq 0.1$ and <0.4. The subscript a may be equal to 1 and is preferably $\geq 0.5$, more preferably $\geq 0.8$, and more preferably $\geq 0.9$. The subscript b may be 1 and is preferably $\geq 0.2$, more preferably $\geq 0.5$.

In another embodiment, a method of preparing the thermoelectric compositions described above comprises adding stoichiometric amounts of starting materials comprising Ag, X, Sn, Pb, M', and Q to a reaction vessel, heating the starting materials to a temperature and for a period of time sufficient to melt the starting materials, and cooling the reaction mixture. In various embodiments, the starting materials comprise elemental starting materials; in other embodiments, the starting materials contain binary compounds or a mixture of binary and elemental starting materials.

In preferred embodiments, the thermoelectric compositions have the properties of p-type semiconductors. In a preferred embodiment, $0.2 \leq a \leq 1$, $0.05 \leq b \leq 1$, $0.01 \leq x \leq 0.6$, $0.01 \leq y \leq 0.6$, and $2 \leq m \leq 30$. In preferred embodiments x and y are $\leq 0.4$. In a preferred embodiments, $b \geq 0.2$ and a is $\geq 0.5$. In various embodiments, Q is selected from the group consisting of Te, Se, and combinations thereof. Preferably, $10 \leq m \leq 20$ or $16 \leq m \leq 18$.

In another embodiment, the invention provides a thermoelectric element comprising an n-type semiconductor and a p-type semiconductor joined electrically to form a couple, wherein the p-type semiconductor comprises a thermoelectric composition or p-type semiconductor composition described above. In preferred embodiments, x and y are both $\leq 0.4$. Also preferably, a is greater than 0.2 and b is greater than or equal to 0.1. In preferred embodiments, the p-type semiconductor has a figure of merit ZT greater than 1.0 and preferably greater than 1.4. In various embodiments, the figure of merit ranges up to about 1.6, up to about 1.8, up to about 2.0, or higher, depending on the optimization of composition and synthesis parameters discussed further below. In further preferred embodiments, the n-type semiconductor of the couple comprises a sub-stoichiometric silver composition, described further below.

The invention also provides a method for generating electrical energy from heat energy, comprising applying heat energy to a thermoelectric module of operating according to the Seebeck effect, wherein the thermoelectric module comprises a p-type semiconductor composition described above.

In one aspect, the compositions and methods of the invention are based on the use of sulfide, selenide, telluride, or mixed chalcogenide compounds in which the negative charge of the chalcogenide is counterbalanced by a combination of monovalent, divalent, and trivalent metallic elements. As described above, the monovalent element is present in the chalcogenide in a non-stoichiometric fashion, either in excess or in deficit, while the trivalent element is present in a sub-stoichiometric amount. To illustrate, the compounds and compositions of the invention may be understood as corresponding to a formula $$M^I_{1 \pm x} M^{II}_m M^{III}_{1-y} Q_{2+m}$$

wherein $M^I$ represents the monovalent (or +1) component, $M^{II}$ represents the divalent (or +2) component, and $M^{III}$ represents the trivalent (or +3) component. In one aspect, the values in parentheses represent the nominal valence charge of the component.

In various embodiments of the invention, the monovalent component $M^I$ is silver, alternatively substituted in part with sodium and/or potassium. The monovalent component of the compositions of the invention is represented in the formulas above by the sub-formula $Ag_a X_{1-a}$, where X is sodium, potassium, or combination thereof. Preferably a is $\geq 0.5$. In other embodiments, a is $\geq 0.8$ or $\geq 0.9$. The subscript a can be equal to 1. The monovalent component $M^I$ is present at a slight stoichiometric excess or deficit, depending on the value of x in the sub-formula $(Ag_a X_{1-a})_{1 \pm x}$ wherein subscripts a and x are described above. The value of x, indicating the stoichiometric excess or deficit depending on the plus or minus sign in the subscript, is greater than 0 and less than 1. Preferably x is greater than 0.1 and less than 0.6 and in preferred embodiments, $x \leq 0.3$, preferably $\leq 0.2$.

In a similar fashion, in various embodiments of the invention, the divalent component $M^{II}$ is Sn or a mixture of Sn and Pb. The divalent component is represented in the formulas above by the sub-formula $(Sn_b Pb_{(1-b)})_m$ wherein $0 < b < 1$, and m is an integer. Preferably b is $\geq 0.05$ and more preferably $\geq 0.2$. The subscript m is an integer from 2 to 30 and so the divalent component is said to be present in a stoichiometric amount, relative to the chalcogenide.

The trivalent component is present in a stoichiometric deficit, indicated algebraically by the positive value of y in the formula above. There, $M^{III}$ is selected from the group consisting of Sb, Bi, lanthanide elements, and combinations thereof. Lanthanide elements include Ce, Pr, Nd, Pm, Sm, Eu, Gd, Tb, Dy, Ho, Er, Tm, Yb, and Lu, with Pm less preferred because of its instability and radioactivity. The variable y is greater than 0 but less than 1. Preferably y is greater than or equal to 0.01 but less than 0.6. preferably less than 0.3.

The chalcogenide Q in the formula above is selected from the group consisting of S, Se, Te, and combinations thereof. In various embodiments of the invention, Q comprises either Te or Se, and m is 14 to 20, preferably 16 to 18.

In embodiments of the invention, the thermoelectric materials exhibit p-type semiconductor behavior. As written with the nominal formula $(Ag_a X_{1-a})_{1 \pm x} (Sn_b Pb_{1-b})_m M'_{1-y} Q_{2+m}$, they appear not to be electrically balanced, at least when the components are assigned their nominal valence charges. Without being bound by theory, in some embodiments it is believed that the nominal lack of electrical balance is compensated by the presence of "extra" holes in the material, thus making the materials p-type semiconductors.

The thermoelectric materials and semiconductor materials of the invention can be synthesized using a variety of starting materials, including binary compounds and the pure elements themselves. Generally, a combination of binary and/or elemental starting materials is used, wherein the starting materials contain the appropriate stoichiometric amounts of Ag, Na, K, Sn, Pb, Sb, Bi, lanthanide elements, S, Se, and Te, depending on the specific composition to be synthesized. Suitable elemental and binary starting materials are commercially available. Binary starting materials include $Ag_2S$, $Ag_2Se$, $Ag_2Te$, $Na_2S$, $Na_2Se$, $Na_2Te$, PbS, PbSe, PbTe, SnS, SnSe, SnTe, $L_2S_3$, $L_2Se_3$, $L_2Te_3$, $Bi_2S_3$, $Bi_2Se_3$, $BiTe_3$, $Sb_2S_3$, $Sb_2Se_3$, and $Sb_2Te_3$, where L is a lanthanide element. Alternatively, the various binary compounds can be prepared from elemental or other starting materials according to published procedures.

In a non-limiting example, the thermoelectric compositions of the invention may be synthesized as follows. The chosen starting materials are thoroughly mixed and loaded into an appropriate reaction device such as a carbon coated quartz or capped graphite tube in an evacuated atmosphere, preferably less than $10^{-4}$ Torr. The mixture is heated at a chosen heating rate to a temperature at or above the melting temperature of the starting materials. A suitable rate of heating is about 30° C. per hour, and a suitable melting temperature is about 700° C. or higher. Alternatively, the mixture is heated to temperatures above the nominal melting points of the starting materials. After maintaining the temperature at or above the melting point for an appropriate period of time, the mixture is cooled at an appropriate cooling rate and the resulting composition isolated. While heating or cooling, the reaction mixture may be held at various temperature plateaus for variable amounts of time, according to the synthesis plan as described further below. For example, after maintaining the temperature at a melt temperature such as 900° C. or higher for a period of time such as about 3 days, the mixture may be cooled to an intermediate temperature such as 300° C. at a rate such as 5° C. per hour. Subsequent cooling down to about 50° C. may take place at a different rate than the cooling to the intermediate temperature. Alternatively, the reaction mixture may be held for periods of time at intermediate temperatures.

During the reaction, and preferably while the reaction starting materials are in the molten state, the reaction vessel is preferably gently rocked or otherwise agitated to promote convection and an intimate mixing of the elemental or binary compound starting materials. Suitable reaction parameters are given in the examples that follow.

In one aspect, thermoelectric materials for the invention are prepared by a process comprising the steps of adding appropriate stoichiometric amounts of starting materials containing Ag, X, Sn, Pb, M', and Q to a reaction vessel, heating the starting materials to a temperature and for a period of time, during which the starting materials melt and react to form the compounds. Then the materials are cooled at a controlled rate.

According to one aspect of the invention, it is recognized that the thermoelectric figure of merit ZT of the resulting material may be subtly affected not only by the stoichiometry of the starting materials but also by synthesis parameters such as the temperature and time of heating, the rate of heating, the rate of cooling, the degree and extent of agitation or rocking during heating to the melt temperature and upon reaching the melt temperature and so on. In many cases, it is desired to produce a material having a specific ZT. In other cases it is desired to find a set of reaction parameters that will give an optimum ZT. In still other cases, it would be desirable to produce materials with an acceptable ZT, but optimize with respect to process time, process cost, or another property.

Thus, the invention also provides methods of formulating thermoelectric materials having a specific composition having the formula wherein the element symbols and subscripts are defined above. In the method, a plurality of samples of the material having specific composition is made by a process described above. Process parameters such as time of heating, rate of heating, temperature of melting, time of melting, temperature profile during reaction, degree of rocking or agitation, and optionally others are varied, preferably in an experimentally designed fashion. Process parameters are selected that produce a desired ZT and other properties in the composition. In this way the ZT of a material may be selected or optimized.

In such methods, reaction parameters may be found that yield materials having a desired ZT by making a plurality of samples of the material having a certain composition. Then a set of syntheses may be carried out by the above process, wherein the parameters are varied and the resulting ZT of the samples is compared. In a preferred embodiment, the parameters to be varied are selected using statistical experimental design.

In one embodiment, the materials of the present invention are not doped, and are substantially free of dopants. As referred to herein, "substantially free" means that the materials contain no dopant, or an amount of dopant that does not significantly affect the thermoelectric characteristics of the material. Preferably such a material contains less than about 0.0001% by weight of dopants.

In various embodiments, the materials are doped with selected impurities to produce p-type conductors having specific desired thermoelectric properties such as enhanced Seebeck coefficients and figures of merit (ZT). In an enhanced n-type conductor, one atom is replaced by another atom having more valence electrons, wherein the extra electrons are not needed for bonding and are free to move throughout the crystal. Isovalent anionic dopants, where S or Se is substituted for Te and S for Se may be used in about less than 1 atomic percent. Other examples of compounds that can be used for doping are the halides $SbX_3$, $BiX_3$, $Hg_2Cl_2$, and $DX_2$ where X is selected from the group consisting of chlorine, bromine, iodine, and mixtures thereof, and D is selected from the group consisting of chromium, manganese, iron, cobalt, nickel, copper, zinc, magnesium, and mixtures thereof. Alternatively, a p-type conductor is formed when an atom in the isostructural compound is replaced by another atom with fewer electrons, leaving a bond vacant wherein this shortage is referred to as a "hole." For the cationic sites of Bi or Sb (Group V) and Pb or Sn (Group IV), doping with one electron deficient elements such as Group IV elements (Ge, Sn, Pb) and Group III elements (Al, Ga, In, Tl), respectively, may produce more hole carriers which give rise to improved electrical properties. These are examples of compounds that can be used for doping and are in no way meant to be limiting.

Doping of the compounds of the present invention can be achieved by introducing the desired amount of dopant during synthesis. Stoichiometric amounts of the dopant can be added to the starting materials. Alternately, the compounds of the present invention can be doped by co-melting the desired compound and the dopant and recooling the new mixture. The amount of dopant preferably ranges from about 0.0001% to about 4% by weight.

In a preferred embodiment, the p-type semiconductor materials are used together with n-type semiconductors of the general formula $Ag_{1-z}M_nM''Q'_{2+n}$, wherein:
(a) M is at least one element selected from the group consisting of Pb (lead), Ca (calcium), Sr (strontium), Ba (barium), divalent transition metals, and combinations thereof;
(b) M'' is at least one element selected from the group consisting of Bi (bismuth), Sb (antimony), and combinations thereof;
(c) Q' is at least one element selected from the group consisting of Se (selenium), Te (tellurium), S (sulfur); and combinations thereof, and
(d) $8 \leq n \leq 30$, and $0.01 \leq z < 1$.

In a preferred embodiment, $0.05 \leq z \leq 0.6$; more preferably $0.1 \leq z \leq 0.3$. Preferably $12 \leq n \leq 24$; more preferably $15 \leq n \leq 22$.

Divalent transition metals useful herein include, V (Vanadium), Cr (Chromium), Mn (Manganese), Fe (Iron), Co (Cobalt), Ni (Nickel), Cu (Copper), Zn(Zinc), Pd (Palladium), Cd (Cadmium), Pt (Platinum), Hg (Mercury), and mixtures thereof. Preferred are the first row transition series (the 4th Period of the Periodic Table), selected from the group consisting of Ti, V, Cr, Mn, Fe, Co, Ni, Cu, and mixtures thereof. Particularly preferred transition metals useful here include Fe, Co, Mn, Cu, V, Cr, and mixtures thereof. (As used herein, the word "include," and its variants, is intended to be non-limiting, such that recitation of items in a list is not to the exclusion of other like items that may also be useful in the materials, compositions and methods of this invention.)

In a preferred embodiment, M is Pb. Preferably, M'' is Sb, Bi, or a combination of Sb and Bi in any ratio such that the total subscript of $Sb_pBi_{1-p}$ adds to unity. In a preferred embodiment, M' is Sb (p=1). Preferably, Q' comprises Te. Preferred n-type semiconductor materials include those selected from the group consisting of $Ag_{1-z}Pb_{12}M''Q'_{14}$; $Ag_{1-z}Pb_{14}M''Q'_{16}$; $Ag_{1-z}Pb_{16}M''Q'_{18}$; $Ag_{1-z}Pb_{18}M''Q'_{20}$; and mixtures thereof. Particularly preferred materials include those selected from the group consisting of $Ag_{0.84}Pb_{18}SbTe_{20}$; $Ag_{0.81}Pb_{18}SbTe_{20}$; $Ag_{0.84}Pb_{18}SbSe_{20}$; $Ag_{0.75}Pb_{18}SbSe_{20}$; $Ag_{0.76}Pb_{18}SbTe_{20}$; and mixtures thereof.

In embodiments of this invention, the n-type thermoelectric materials generally have a cubic crystal lattice structure of the same type as NaCl, wherein the cations (such as Ag, M, and M'') occupy the Na sites and the anions (Q') occupy the Cl sites. The cations, although differing in charge, are similar in size and tend to become randomly dispersed throughout the structure. Because x is greater than zero, some of the cation sites in the cubic structure will be vacant in embodiments of this invention. The cubic crystal structure is independent of the values for z and n and depends only on the elements selected to form the thermoelectric materials. A property of preferred embodiments is a morphology of low anisotropy. The cubic structure also gives rise to relatively high carrier mobilities and ease of crystal growth and processing. The n-type semiconductor compounds of the present invention also have relatively high melting point temperatures, and a high degree of structural stability. In embodiments of this invention, the melting temperatures are greater than about 850° C.

Uses of the Materials:

The thermoelectric materials of the present invention can be used in optical applications including infrared and near infrared detectors, lasers and photovoltaic cells such as solar cells. In optical applications, at least two materials having different band gaps are layered together to give the desired optical properties. The thermoelectric materials of the present invention have a wide range of band gaps that can be finely tuned to give optimal performance in such optical applications. The isostructural compounds of the present invention can also be used in multi-spectral sensors. Multi-spectral sensors (e.g. long wavelength and short wavelength) offer the possibility of improved clutter rejection and improved recognition range.

In various embodiments, the thermoelectric compounds of this invention are used in thermoelectric devices. Such devices may be used for heating, cooling, temperature stabilization, power generation and temperature sensing. Such thermoelectric devices are essentially heat pumps and power generators which follow the laws of thermodynamics in the same manner as mechanical heat pumps, refrigerators, or any other apparatus used to transfer heat energy. The principal difference is that thermoelectric devices function with solid state electrical components (thermocouples) as compared to more traditional mechanical/fluid heating and cooling components.

The efficiency of the thermoelectric materials in such devices is often characterized by a thermoelectric figure of merit, ZT. ZT is a dimensionless parameter and is conventionally defined as:

$$ZT = (S^2 \sigma / \kappa) T;$$

where S is the thermopower or Seebeck coefficient, σ the electrical conductivity (S/cm), κ the thermal conductivity (W/m-K) and T the temperature (K). The figure of merit represents the coupling between electrical and thermal effects in a material. The larger the ZT, the higher the energy conversion efficiency of a thermoelectric material. An efficient thermoelectric material should have a large Seebeck coefficient, high electrical conductivity, and low thermal conductivity. The figure of merit of ZT can be measured by determining the thermopower, electrical conductivity, and thermal conductivity of a material as a function of temperature according to well known methods. Although dimensionless, the figure of merit is a function of temperature, and is reported as a figure of merit ZT at a temperature T. Preferred p-type semiconductors have a figure of merit, measured at 800 K, of greater than or equal to 1.0, preferably greater than or equal to 1.4, and more preferably greater than or equal to 1.6. Depending on the compositions and the optimization of synthesis parameters, in various embodiments the p-type semiconductors have a figure of merit up to about 1.4, up to about 1.6, up to about 1.8, or even higher.

An efficient thermoelectric device is fabricated from two materials: an n-type conductor and a p-type conductor. Each material is separately chosen to optimize the figure of merit, ZT. These thermoelectric devices preferably contain thermoelectric elements made of a circuit of the n-type semiconductor and the p-type semiconductor joined electrically in series, to form a thermocouple. The couple of n- and p-type semiconductors may be a p-n junction in a semiconductor crystal, or it may take the form of a conductor physically affixed to the ends of the semiconductors. The n-type material and the p-type material are preferably chosen to have compatible properties, so the physical properties of one semiconductor material does not limit the physical properties of the other semiconductor material when they are formed into a semiconductor couple.

A plurality of thermocouples may be joined together electrically in series, and thermally in parallel, to form a thermoelectric module (or thermopile), that serves as a solid state heat pump or thermoelectric generator. Generally, the p-type and n-type semiconductors, in the form of, for example, wafers or pellets, may be formed into an array by being sandwiched between, for example, metallized substrates. By connecting a thermoelectric module to a direct circuit (DC) power source in a heating or cooling device, heat will be absorbed at one end of the device, thereby cooling it while heat is rejected at the device's other end. In a power generation device, current is generated in the external circuit by creating a thermal gradient across the device.

Several methods for constructing thermoelectric devices have been developed. Such methods include without limitation, mechanical clamping, epoxy bonding, and direct solder bonding. The individual requirements of the application will in general determine which method is most appropriate. In a preferred embodiment, mechanical clamping is used. Whichever method of installation is used, it is important to avoid excessive mechanical loading of the module.

Thermal resistance occurs at each interface of an assembly and affects overall system performance. In mechanically clamped systems, the flatness of interface surfaces is preferably within 0.03 mm. In preferred embodiments, even with this degree of flatness, interface materials may be used to fill in small thermal gaps. Typical choices for such interface materials include silicone-based thermal grease, graphite foil, and thermally conductive pads. Special care should be taken to ensure that uniform pressure is applied during installation. Preferably, the mounting and module surfaces should be cleaned to remove grit, burrs, and the like.

Figure 1A:
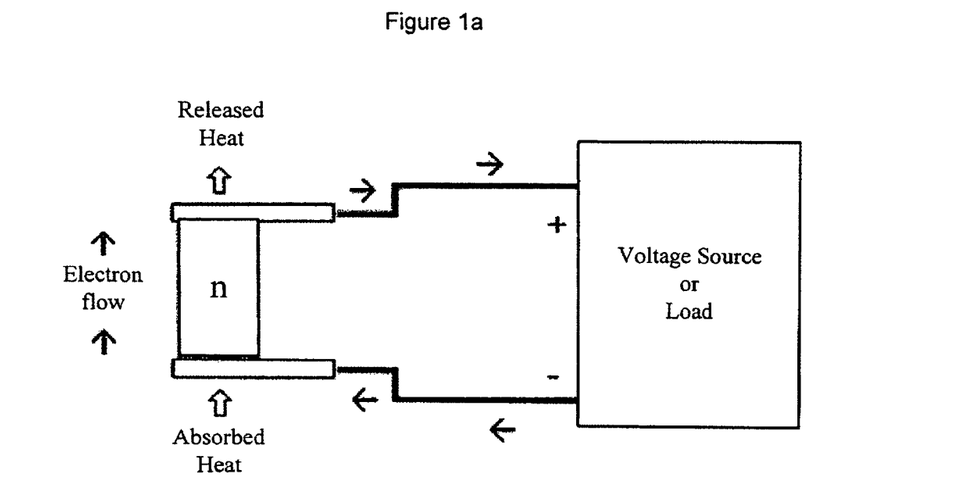
FIGS. 1a and 1b are schematic diagrams of simple thermoelectric circuits.
Figure 1B:
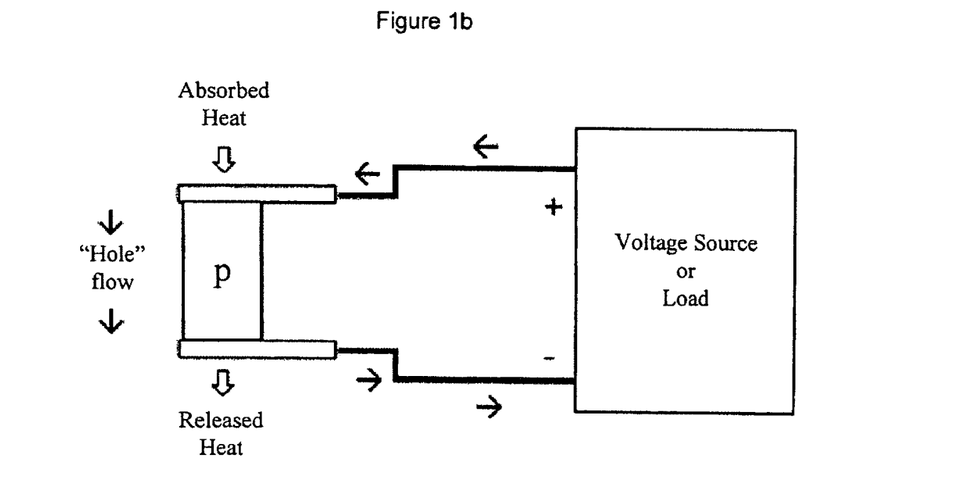
Figure 2:
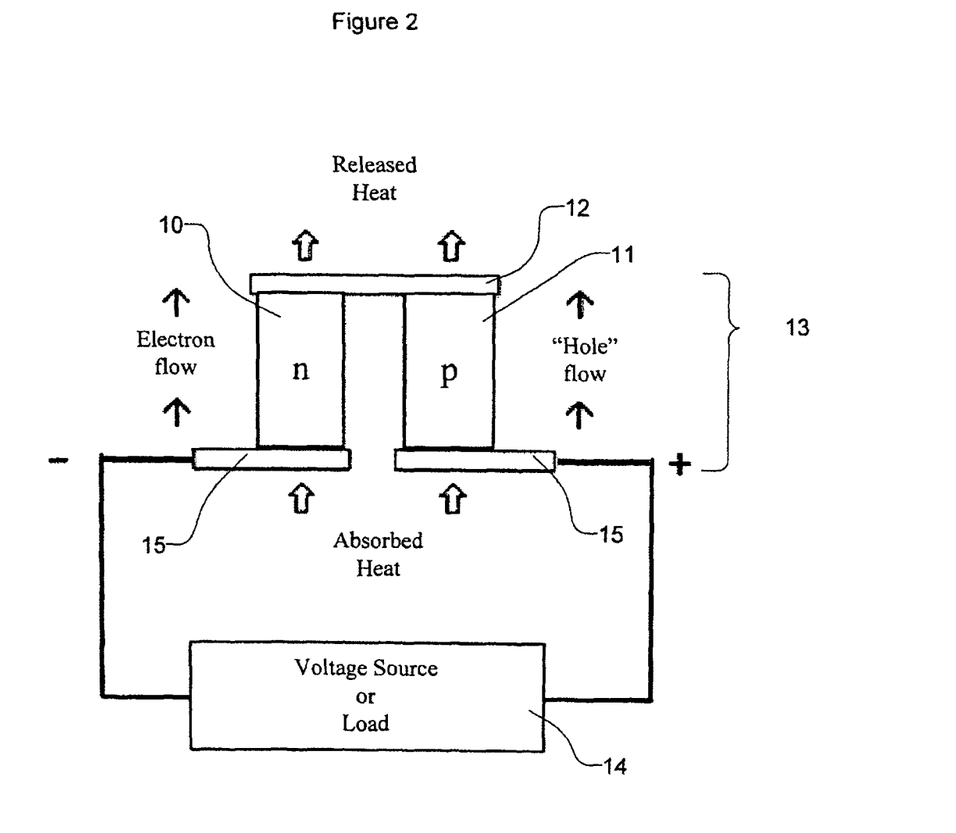
FIG. 2 is a schematic diagram of a thermoelectric couple.

A simple thermocouple is schematically illustrated in FIG. 2. An n-type semiconductor (10) and a p-type semiconductor (11) are connected at one end to a conductor (12) to form a couple (13). The semiconductors (15) are connected at the other end to an external circuit, here illustrated by second conductors (15) attached to lead wires connecting the couple to the external circuit (14).

The external circuit (14) may take on a number of forms, depending on the use for which the thermoelectric device containing the thermoelectric elements of the invention is intended. For example, the external circuit may include a source of DC power, in which case the thermoelectric device operates as a heat pump according to the Peltier effect. In another embodiment, the external circuit (14) may contain an electric load, in which case the thermoelectric device operates as a thermoelectric generator according to the Seebeck effect.

Figure 3A:
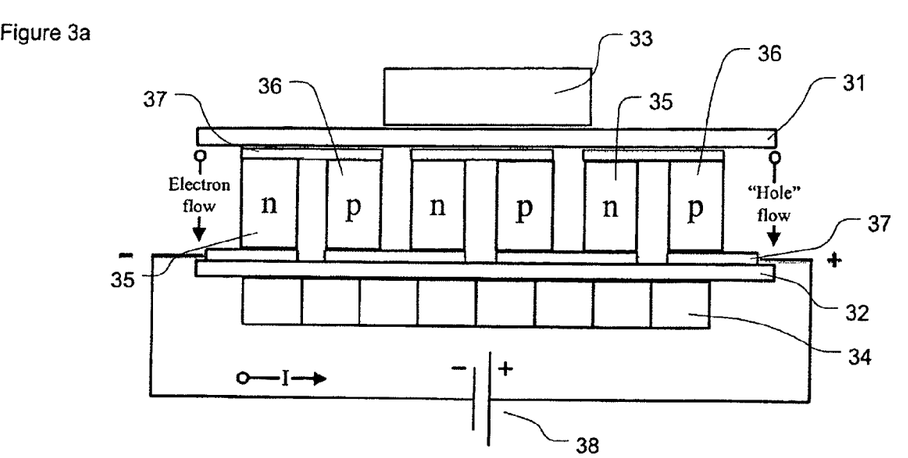
FIGS. 3a and 3b are schematic diagrams of thermoelectric heat pump and power generation devices.

A non-limiting embodiment of a heat pump incorporating a thermoelectric device of the present invention is illustrated in FIG. 3a. The heat pump comprises an upper ceramic substrate (31) and a lower ceramic substrate (32). The outer surface of the upper ceramic substrate (31) (i.e., the surface opposite from the surface in contact with the semiconductor array) is placed in contact with the surface of an object to be cooled (33) and the outer surface of the lower ceramic substrate (32) is contacted with a heat sink (34) to dissipate absorbed heat. N-type semiconductors (35) and p-type semiconductors (36) are provided between the upper ceramic substrate (31) and the lower ceramic substrate (32). Electrically conductive layers (37) are provided on the inside of the ceramic substrate (31 and 32), electrically joining adjacent n-type semiconductor and p-type semiconductors, so the semiconductors are electrically in series. A direct current source (38) is connected to the conductors (37) so that current flow is in the direction of the flow of heat through the device.

In operation, heat is absorbed at the first ceramic substrate (31) and rejected at the second ceramic substrate (32) through the heat sink (34) by the Peltier Effect when conductors (37) are connected to the DC source (38) in the manner illustrated in FIG. 3a. The direction of heat flow in the heat pump may be reversed by reversing the current flow to the conductive layers—upon such reversal the thermoelectric device can heat the object (33) in thermal contact with the first substrate (31) by the Peltier effect. This application of heat pumping may be applied in a variety of applications, including small laser diode coolers, cooling of solid state electrical components, portable refrigerators, scientific thermal conditioning, liquid coolers, and the like.

Thermoelectric systems may be designed having a variety of capacities for pumping heat, for example in watts or BTU per hour. The capacity for pumping heat will be influenced by a number of factors, including ambient temperature, physical and electrical characteristics of the thermoelectric modules employed, and efficiency of the heat dissipation system or sink. Typical thermoelectric applications will pump heat loads ranging from several milliwatts to hundreds of watts.

In a preferred embodiment, the present invention provides thermoelectric power generators, that function as thermoelectric generators by the Seebeck effect. When a source of heat is provided to a thermoelectric element containing a couple of p-type and n-type semiconductor material, current is generated in an external circuit. The net affect of the device is to convert heat energy into electric energy. The heat may come from a number of sources, including solar energy, kerosene lamps, firewood, automobile exhaust heat, stationary combustion engine exhaust heat, and radioactive sources such as $^{90}$Sr.

Figure 3B:
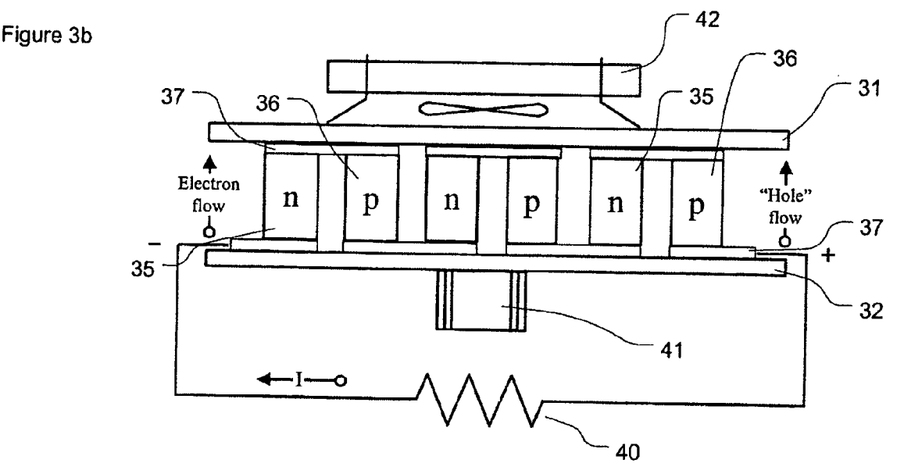

Thermoelectric generators of the invention are schematically exemplified in FIG. 3b. This system is similar to that of the cooling/heating system of FIG. 3a, except that the voltage supply is replaced with an electrical load. N-type semiconductors (35) and p-type semiconductors (36) are electrically joined in series with conductors (37). The electrodes are connected with leads to a load (40). The semiconductors are arranged thermally in parallel, sandwiched between an upper ceramic substrate (31) at the cold junction, and a lower ceramic substrate (32) at the hot junction. The thermoelectric generator generates a current when the hot junction is heated with a heater (41) to temperature $T_H$. The cold junction is cooled to a temperature $T_C$ lower than $T_H$ using a cooling fan (42). A voltage difference exists across the device as a result of the Seebeck effect. If a load resistance (40) is provided in the circuit, the voltage difference between the electrodes will produce an electric current. In this way, the thermoelectric generator illustrated in FIG. 3b turns heat energy into electric energy in the load resistance.

The invention has been described above, with respect to various preferred embodiments. Further non-limiting description is given in the examples that follow.

EXAMPLES

Example 1

A thermoelectric material of formula $Ag_{0.9}Pb_9Sn_9Sb_{0.6}Te_{20}$ is prepared by using stoichiometric amounts of Ag (0.2234 g), Pb (4.2919 g), Sn (2.4586 g), Sb (0.1681 g), and Te (5.8726 g). The elements are loaded in a 13 mm quartz tube and sealed under vacuum ($10^{-4}$ Torr or below). The tube is placed in a furnace and heated up to a temperature of 980° C. in 20 hours. The furnace is maintained still at 980° C. for 1 hour followed by rocking at 980° C. for 2 hours. Rocking is carried out at a frequency of 1-2 periods/min. The furnace then stops rocking and stays vertically at 980° C. for another 1 hour. The furnace is then cooled to 450° C. in 53 hours and further cooled to 50° C. in 20 hours.

Electrical conductivity, thermopower, and thermal conductivity are measured from 300 K to 800 K and the figure of merit is calculated as a function of temperature. The figure of merit is approximately 1.0 at 620 K, approximately 1.3 at 700 K, and approximately 1.4 at 800 K.

Example 2

In a similar fashion, $Ag_{0.9}Pb_{10}Sn_8Sb_{0.8}Te_{20}$ is prepared. It has a figure of merit ZT of 1.6 at 800 K.

The invention has been described above, with respect to various preferred embodiments. It is to be understood that the description, examples, and figures are meant to be illustrative only, and the invention is not to be limited by the disclosed embodiment. Variations and modifications that would occur to a person of skill in the art upon reading the specification are also within the scope of the invention, which is set forth in the appended claims.

We claim:

1. A thermoelectric composition comprising a material represented by general formula $$(Ag_aX_{1-a})_{1\pm x}(Sn_bPb_{1-b})_mM'_{1-y}Q_{2+m}$$

wherein
X is Na, K, or a combination of Na and K in any proportion;
M' is a trivalent element selected from the group consisting of Sb, Bi, lanthanide elements, and combinations thereof;
Q is a chalcogenide element selected from the group consisting of S, Te, Se, and combinations thereof;
a and b are independently greater than 0 and less than or equal to 1,
x and y are independently greater than 0 and less than 1; and
$2 \leq m \leq 30$,
wherein the material in the above formula is not charge balanced, or the material in the above formula is charged balanced but the subscript $(1\pm x)$ of $(Ag_a X_{1-a})$ is not numerically equal to the subscript $(1-y)$ of M'.

2. The thermoelectric composition according to claim 1 wherein $0.01 < x < 0.6$ and $0.01 < y < 0.6$.

3. The thermoelectric composition according to claim 1, wherein $0.01 \leq x \leq 0.3$ and $0.01 \leq y \leq 0.4$.

4. The thermoelectric composition according to claim 1, wherein a=1.

5. The thermoelectric composition according to claim 1, wherein b=1.

6. The thermoelectric composition according to claim 1, wherein b≧0.05.

7. The thermoelectric composition according to claim 1, wherein b≧0.2.

8. The thermoelectric composition according to claim 1, wherein a≧0.5.

9. The thermoelectric composition according to claim 1, wherein a≧0.8.

10. The thermoelectric composition according to claim 1, wherein a≧0.9.

11. The thermoelectric composition according to claim 1, wherein the thermoelectric composition is a p-type semiconductor material.

12. A method of making a conductive material of general formula:

$$(Ag_aX_{1-a})_{1\pm x}(Sn_bPb_{1-b})_mM'_{1-y}Q_{2+m}$$

wherein
X is Na, K, or a combination of Na and K in any proportion;
M' is a trivalent element selected from the group consisting of Sb, Bi, lanthanide elements, and combinations thereof;
Q is a chalcogenide element selected from the group consisting of S, Te, Se, and combinations thereof;
a and b are independently greater than 0 and less than or equal to 1,
x and y are independently greater than 0 and less than 1; and
2≦m≦30 the method comprising
(1) adding stoichiometric amounts of starting materials comprising Ag, X, Sn, Pb, M' and Q to a reaction vessel to form a reaction mixture;
(2) heating the starting materials to a temperature and for a period of time sufficient to melt the starting materials; and
(3) cooling the reaction mixture,
wherein the material in the above formula is not charge balanced, or the material in the above formula is charged balanced but the subscript (1±x) of ($Ag_a X_{1-a}$) is not numerically equal to the subscript (1−y) of M'.

13. The method according to claim 12, wherein the starting materials comprise elemental starting materials.

14. The method according to claim 12, wherein a≧0.5 and b≧0.1.

15. The method according to claim 12, wherein x≦0.4 and y≦0.4.

16. The method according to claim 12, wherein a=1.

17. The method according to claim 12, wherein x≦0.2 and y≦0.2.

18. A p-type semiconductor composition comprising material represented by a general formula $$(Ag_aX_{1-a})_{1\pm x}(Sn_bPb_{1-b})_mM'_{1-y}Q_{2+m}$$

wherein
X is Na, K, or a combination of Na and K in any proportion;
M' is a trivalent element selected from the group consisting of Sb, Bi, lanthanide elements, and combinations thereof;
Q is a chalcogenide element selected from the group consisting of S, Te, Se, and combinations thereof;
0.2≦a≦1,
0.05≦b≦1,
0.01≦x≦0.6,
0.01≦y≦0.6, and
2≦m≦30,
wherein the material in the above formula is not charge balanced, or the material in the above formula is charged balanced but the subscript (1±x) of ($Ag_a X_{1-a}$) is not numerically equal to the subscript (1−y) of M'.

19. A composition according to claim 18, wherein x≦0.2 and y≦0.2.

20. The p-type semiconductor composition according to claim 18, wherein b≦0.5 and a≧0.5.

21. The p-type semiconductor composition according to claim 18, wherein Q is Te.

22. The p-type semiconductor composition according to claim 18, wherein Q is Se.

23. The p-type semiconductor composition according to claim 18, wherein m is from 16 to 18.

24. The p-type semiconductor composition according to claim 23, selected from the group consisting of $Ag_{0.9} Pb_9 Sn_9 Sb_{0.6} Te_{20}$ and $Ag_{0.9} Pb_{10} Sn_8 Sb_{0.8} Te_{20}$.

25. A thermoelectric element comprising an n-type semiconductor and a p-type semiconductor joined electrically to form a couple, wherein the p-type semiconductor comprises a material of general formula $$(Ag_aX_{1-a})_{1\pm x}(Sn_bPb_{1-b})_mM'_{1-y}Q_{2+m}$$

wherein
X is Na, K, or a combination of Na and K in any proportion;
M' is a trivalent element selected from the group consisting of Sb, Bi, lanthanide elements, and combinations thereof;
Q is a chalcogenide element selected from the group consisting of S, Te, Se, and combinations thereof;
a and b independently greater than 0 and less than or equal to 1;
x and y independently greater than 0 and less than 1; and
2<m≦30,
wherein the material in the above formula is not charge balanced, or the material in the above formula is charged balanced but the subscript (1±x) of ($Ag_a X_{1-a}$) is not numerically equal to the subscript (1−y) of M'.

26. The thermoelectric element according to claim 25, wherein x≦0.4 and y ≦0.4.

27. The thermoelectric element according to claim 25, wherein a≧0.2 and b≧0.1.

28. The thermoelectric element according to claim 25, wherein Q comprises Te.

29. The thermoelectric element according to claim 25, wherein Q comprises Se.

30. The thermoelectric element according to claim 25, wherein the p-type semiconductor has a figure of merit ZT of at least about 1.4 at about 800 K.

31. The thermoelectric element according to claim 25, wherein the n-type semiconductor comprises a substoichiometric silver composition.

32. The thermoelectric element according to claim 31, wherein the substoichiometric silver composition comprises a material of general formula $$Ag_{1-z}M_nM''Q'_{2+n}$$

wherein
0.01≦z<1;
M is selected from the group consisting of Pb, Sn, Ca, Sr, Ba, divalent transition metals, and combinations thereof;

M" is selected from the group consisting of Bi, Sb and combinations thereof;

Q' is selected from the group consisting of S, Se, Te, and combinations thereof; and $8 \leq n \leq 30$.

33. The thermoelectric element according to claim 32, wherein $0.1 \leq z \leq 0.3$.

34. The thermoelectric element according to claim 32, wherein M is Pb.

35. The thermoelectric element according to claim 32, wherein Q' comprises Te.

36. The thermoelectric element according to claim 32, wherein M' comprises Sb.

37. The thermoelectric element according to claim 32, wherein $n \geq 10$.

38. A thermoelectric generator comprising a thermoelectric element according to claim 31.

39. A thermoelectric generator comprising a thermoelectric element according to claim 32.

40. A method for generating electrical energy from heat energy, comprising applying the heat energy to a thermoelectric module operating according to the Seebeck effect, wherein the thermoelectric module comprises a p-type semiconductor composition comprising a material of general formula $$(Ag_a X_{1-a})_{1 \pm x}(Sn_b Pb_{1-b})_m M'_{1-y} Q_{2+m}$$

wherein

X is Na, K, or a combination of Na and K in any proportion;

M' is a trivalent element selected from the group consisting of Sb, Bi, lanthanide elements, and combinations thereof;

Q is a chalcogenide element selected from the group consisting of S, Te, Se, and combinations thereof;

a and b are independently greater than 0 and less than or equal to 1, x and y are independently greater than 0 and less than 1; and $2 \leq m \leq 30$, wherein the material in the above formula is not charge balanced, or the material in the above formula is charged balanced but the subscript $(1 \pm x)$ of $(Ag_a X_{1-a})$ is not numerically equal to the subscript $(1-y)$ of M'.

41. The thermoelectric element according to claim 40, wherein $x \leq 0.4$ and $y \leq 0.4$.

42. The thermoelectric element according to claim 40, wherein $a \geq 0.2$ and $b \geq 0.1$.

43. The thermoelectric element according to claim 40, wherein Q comprises Te.

44. The thermoelectric element according to claim 40, wherein Q comprises Se.

45. The thermoelectric element according to claim 40, wherein the p-type semiconductor has a figure of merit ZT of at least about 1.4 at about 800 K.

46. The thermoelectric element according to claim 40, wherein the thermoelectric module further comprises an n-type semiconductor comprising a substoichiometric silver composition.

47. The thermoelectric element according to claim 46, wherein the substoichiometric silver composition comprises a material of general formula $$Ag_{1-z}M_n M''Q'_{2+n}$$

wherein $0.01 \leq z < 1$;

M is selected from the group consisting of Pb, Sn, Ca, Sr, Ba, divalent transition metals, and combinations thereof;

M" is selected from the group consisting of Bi, Sb and combinations thereof;

Q' is selected from the group consisting of S, Se, Te, and combinations thereof;

and $8 \leq n \leq 30$.

48. The method according to claim 47, wherein $0.05 \leq z \leq 0.3$.

49. The method according to claim 47, wherein M is Pb.

50. The method according to claim 47, wherein Q' is Te.

51. The method according to claim 47, wherein M' comprises Sb.

52. The method according to claim 47, wherein $n \geq 10$.

53. The method according to claim 40, wherein the heat energy is supplied by radioactive decay.

54. The method according to claim 40, wherein the heat energy is supplied by solar energy.

55. The method according to claim 40 wherein the heat energy is supplied by burning of fossil fuels.

* * * * *